United States Patent
Mollier et al.

(10) Patent No.: US 10,587,202 B2
(45) Date of Patent: Mar. 10, 2020

(54) ELECTRICAL INSULATION DEVICE

(71) Applicant: Schneider Electric Industries SAS, Rueil Malmaison (FR)

(72) Inventors: Christophe Mollier, Chamoz sur Ain (FR); Philippe Caous, Villemoirieu (FR); Sebastian Quintana Delgado, Grenoble (FR)

(73) Assignee: Schneider Electric Industries SAS, Rueil Malmaison (FR)

( * ) Notice: Subject to any disclaimer, the term of this patent is extended or adjusted under 35 U.S.C. 154(b) by 301 days.

(21) Appl. No.: 15/637,348

(22) Filed: Jun. 29, 2017

(65) Prior Publication Data

US 2018/0005871 A1 Jan. 4, 2018

(30) Foreign Application Priority Data

Jul. 1, 2016 (FR) ...................................... 16 56290

(51) Int. Cl.
| | |
|---|---|
| *H02M 5/06* | (2006.01) |
| *H01C 13/02* | (2006.01) |
| *G01R 15/04* | (2006.01) |
| *H01C 1/16* | (2006.01) |
| *H02M 5/08* | (2006.01) |
| *H01G 4/40* | (2006.01) |
| *H01G 4/38* | (2006.01) |
| *H01F 27/02* | (2006.01) |
| *H01L 21/02* | (2006.01) |
| *H01L 27/11558* | (2017.01) |

(52) U.S. Cl.
CPC ............. *H02M 5/06* (2013.01); *G01R 15/04* (2013.01); *H01C 1/16* (2013.01); *H01C 13/02* (2013.01); *H01F 27/022* (2013.01); *H01G 4/38* (2013.01); *H01G 4/40* (2013.01); *H01L 21/02225* (2013.01); *H01L 21/02521* (2013.01); *H01L 27/11558* (2013.01); *H02M 5/08* (2013.01)

(58) Field of Classification Search
CPC . H01G 4/40; H01G 4/38; H01C 13/02; H01C 1/16; G01R 15/04; H02M 5/08; H02M 5/06
See application file for complete search history.

(56) References Cited

U.S. PATENT DOCUMENTS

| | | |
|---|---|---|
| 2013/0088092 A1 | 4/2013 | Ladron De Guevara et al. |
| 2013/0169263 A1 | 7/2013 | Garabieta Artiagoitia et al. |

OTHER PUBLICATIONS

French Preliminary Search Report dated Mar. 16, 2017 in French Application 16 56290, filed on Jul. 1, 2016 (with English Translation of Categories of cited documents).

*Primary Examiner* — Livius R. Cazan
(74) *Attorney, Agent, or Firm* — Oblon, McClelland, Maier & Neustadt, L.L.P.

(57) ABSTRACT

An electrical isolation device including a support with thickness E including two faces facing one another, referred to, respectively, as the two faces having a length L, a width l; on each face of the support, a plurality of voltage dividers is positioned extending over the length, each voltage divider including electrical components that are connected in series and arranged according to a first and a second stage, each first stage including a row of even components and a row of odd components, the rows being parallel, and adjacent, and the second stage corresponding to a linear arrangement of components.

16 Claims, 4 Drawing Sheets

ELECTRICAL INSULATION DEVICE

TECHNICAL FIELD

The invention relates to an electrical insulation device for measuring the line voltage in direct or alternating current.

More particularly, the present invention relates to a device provided with voltage dividers intended to protect against voltage surges during operations of maintenance or monitoring of a low-voltage line. By low voltage we mean a line having a voltage less than 1200 V AC and 1500 V DC, such as 230 V AC.

PRIOR ART

The networks for high-voltage (HV) electrical production and distribution have attained such a robustness that electrical incidents are substantially observed in the area of the medium-voltage (MV) and low-voltage (LV) networks.

Thus, this evolution is leading to the monitoring of voltages, with voltage sensors, coming from MV and LV lines. The normative constraints defined in the standards IEC60664-1, IEC60255-27, IEC60255-5 impose the electrical insulations which need to be followed in order to ensure the safety of persons, for example during the handling of the voltage sensors, or during operations of maintenance or monitoring of LV networks. Thus, the aforementioned standards and/or the users require, for example, a protection of the operators against possible voltage surges of the order of 10 kV to 50 Hz for 10 minutes, and of the order of 20 kV to 50 Hz for a single pulse.

This is why it has been proposed to employ a potential transformer (such as the one represented in FIG. 1) to ensure the electrical insulation and the transformation of three-phase LV voltage measurements.

However, this solution is not satisfactory.

In fact, potential transformers (PT) are heavy, and present a considerable footprint, thus limiting their integration into a modular system comprising, for example, modules arranged on DIN rails, such as is represented in FIG. 8.

Furthermore, the voltage measured on the output terminals of a PT does not vary in a linear manner with the voltage imposed at the input of said PT (the latter depends, for example, on the measured voltage frequency, the voltage range in which the voltage is located, etc.). Thus, the scaling of the voltage imposed at the input of the PT, and by said PT, is not linear. By scaling we mean the transformation of a voltage to another voltage (a lower one, for example). A linear system performs a homothetic scaling, in other words the input voltage is multiplied by a constant proportionality factor, and thus is independent of the input voltage. This nonlinearity of a PT detracts from the quality and reliability of the voltage measurements.

Alternatively, insulation can also be ensured by optocouplers. However, these devices require an electrical power supply and, thus, an adapted connector. Thus, they are not satisfactory.

Document US20130088092 describes an electrical insulation device.

One purpose of the invention is thus to propose an insulation device having a smaller footprint than the insulators known in the prior art.

Another purpose of the invention is to propose an insulation device adapted to the scaling of a medium voltage without causing any problems of nonlinearity.

Another purpose of the invention is also to propose an insulation device respecting the waveform of the measured electrical voltage.

EXPLANATION OF THE INVENTION

The purposes of the invention are accomplished by an electrical insulation device comprising:
 a support with thickness E comprising two faces facing one another, referred to, respectively, as front face and rear face, the two faces having a length L, a width l,
 on each face of the support, a plurality of voltage dividers is positioned extending over the length L of said face, each voltage divider comprising electrical components that are connected in series and arranged consecutively according to a first and a second stage, each first stage comprising a row of even electrical components and a row of odd electrical components, the two rows being parallel along the length L, and substantially adjacent along the width l, and the second stage corresponding to a linear arrangement of the electrical components.

According to one embodiment, for each of the rows of even electrical components and the rows of odd electrical components the spacing along the length L between two electrical components of a same row is less than the spacing needed for the insertion of an electrical component.

According to one embodiment, the spacing along the width l of the rows of even electrical components and the rows of odd electrical components arranged on a same face is regular, this spacing being advantageously less than the spacing needed for the insertion of an electrical component.

According to one embodiment, in each of the rows of even and odd electrical components the arrangement of said electrical components is regular along a step T in the direction of the length L.

According to one embodiment, the even rows of the two faces of the support are in phase with each other, and the odd rows of the two faces of the support are likewise in phase with each other.

According to one embodiment, the even rows have an offset along the length L with respect to the odd rows, the offset being advantageously that of a half-step T/2.

According to one embodiment, the support comprises at least one armouring layer inserted between two layers of electrical insulator, and disposed substantially parallel to the two faces of the support, the armouring layer being adapted to reduce the crosstalk between electrical components facing each other across the thickness E of the support.

According to one embodiment, the armouring layer comprises a metal, the metal advantageously comprises at least one of the elements chosen from among: copper.

According to one embodiment, the two layers of electrical insulator comprise a dielectric material, the dielectric material advantageously comprises at least one of the elements chosen from among: epoxy, FR4, bakelite.

FR4 is a type of epoxy reinforced with glass fibres.

According to one embodiment, the second stages are arranged in parallel with each other along the length L, the second stages of the front face being staggered along the width l in relation to the second stages of the rear face such that no electrical component of the second stages of a face is facing, even partially, another electrical component arranged on the other face.

According to one embodiment, the armouring layer extends only over a first surface, the first surface being the surface facing the surface occupied by the first stages.

According to one embodiment, two first stages each disposed on a different face of the support can have only a single row of electrical components facing each other across the thickness E of the support, so that at least one row of components on one of the two faces is not facing any row disposed on the other face.

According to one embodiment, the armouring layer extends only over a second surface, the second surface being limited to the projection along the direction E of the surface occupied by the rows of the front face each facing a row of the rear face.

According to one embodiment, the second stages of the voltage dividers comprise one free end designed to be connected to a source of low voltage. According to one embodiment, the first stages of the voltage dividers each comprise one free end designed to be connected to a voltage measuring device.

According to one embodiment, an Ethernet connector of RJ45 type is disposed on the support so as to provide the connection between the free ends of the first stages and the voltage measuring device.

According to one embodiment, the electrical components of the voltage dividers form a printed circuit board with the support.

According to one embodiment, all the electrical components of all the voltage dividers are identical, advantageously the electrical components are electrical resistors.

According to one embodiment, the thickness E of the support is less than 1.6 mm.

According to one embodiment, the support furthermore comprises a moulding and an overmoulding designed to provide, respectively, an electrical insulation and a mechanical strength of the device.

According to one embodiment, the device is provided with means of fixation on a rail, such as a DIN rail.

BRIEF DESCRIPTION OF THE DRAWINGS

Other characteristics and advantages will appear in the following description of embodiments of an electrical insulation device according to the invention, provided as non-limiting examples, making reference to the enclosed drawings, in which.

DETAILED EXPLANATION OF PARTICULAR EMBODIMENTS

For the different embodiments, the same references shall be used for identical elements or those providing the same function, in order to simplify the description. In FIGS. 2 to 8, one finds exemplary embodiments of an electrical insulation device 10 according to the present invention.

Figure 4:
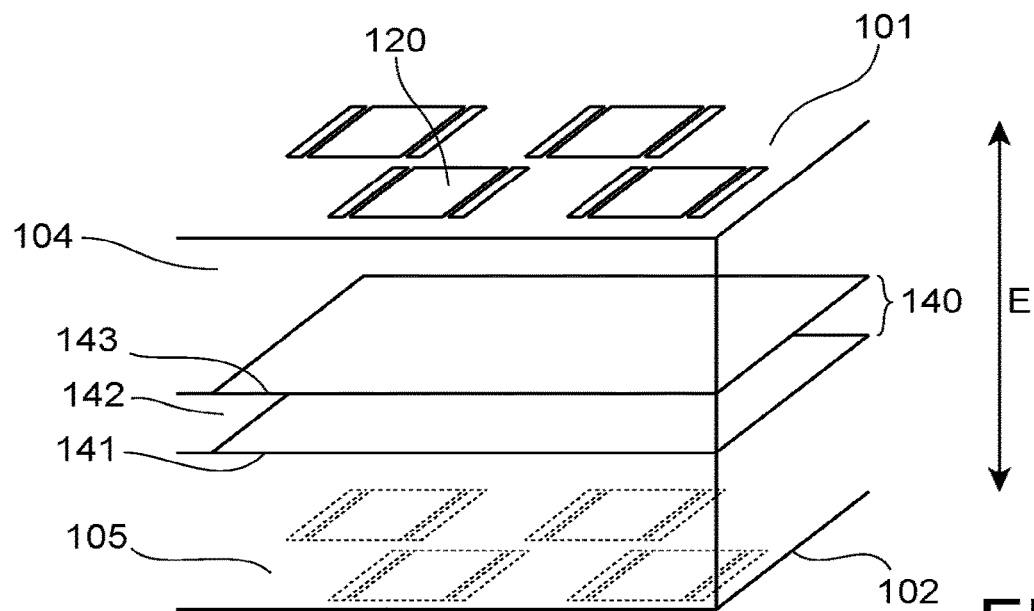
FIG. 4 is a schematic representation of an armouring layer comprising 3 layers of insulator one on top of the other.

The electrical insulation device 10 comprises a support 100 of thickness E (FIG. 4).

The support 100 comprises two substantially parallel faces 101 and 102, conventionally referred to as front face 101 and rear face 102. The front 101 and rear 102 faces are joined by a contour surface. The front face 101 and the rear face 102 can be rectangular in shape, with length L and width l.

We shall consider throughout the course of the explanation that the length L is greater than the width l. The support 100 can be a printed circuit board support 100 ("PCB").

We shall likewise conflate throughout the discussion the length of the support 100 and the length of the front 101 and rear 102 faces.

The support has a thickness E. By thickness E of the support we mean the distance between the front face 101 and the rear face 102 of the support along a direction perpendicular to one of the faces 101 and 102.

Unless otherwise stated, we shall conflate throughout the discussion the length L and the direction along the length L.

Unless otherwise stated, we shall conflate throughout the discussion the width l and the direction along the width l.

Unless otherwise stated, we shall conflate throughout the discussion the thickness E and the direction along the thickness E.

On each of the faces (the front face 101 and the rear face 102) of the support 100, a plurality of voltage dividers 110 is positioned. The voltage dividers 110 according to the invention comprise electrical components 120 connected in series. By connected in series is meant electrically connected in series, also throughout the course of the explanation we shall omit the term "electrically" for simplification.

It is clear that the voltage dividers 110 are electrically isolated one from the others.

The electrical components 120 may comprise electrical resistors or capacitors.

The following embodiments of the invention shall be described in the context of electrical components constituted of electrical resistors, it being understood that said embodiments may just as well be embodied with capacitors.

The electrical connection between the electrical resistors 120 is provided by metal tracks 130.

The electrical resistors 120 are advantageously disposed on the front face 101 and the rear face 102, and brazed to the metal tracks 130. We shall not further describe these manufacturing steps, which are known to the person skilled in the art.

Each voltage divider 110 is formed only on one of the two faces of the support 100. In other words, there is no electrical connection between two electrical resistors 120 disposed on either side of the support 100. Moreover, each voltage divider 110 extends along the length L of the surface on which it is disposed. By extend along the length L of the surface is meant that the voltage divider 110 is substantially parallel to the direction defined by said length L. Thus, inasmuch as each voltage divider 110 extends along the length L of the face on which it is disposed, the person skilled in the art understands that the voltage dividers 110 are parallel to each other.

Figure 3:
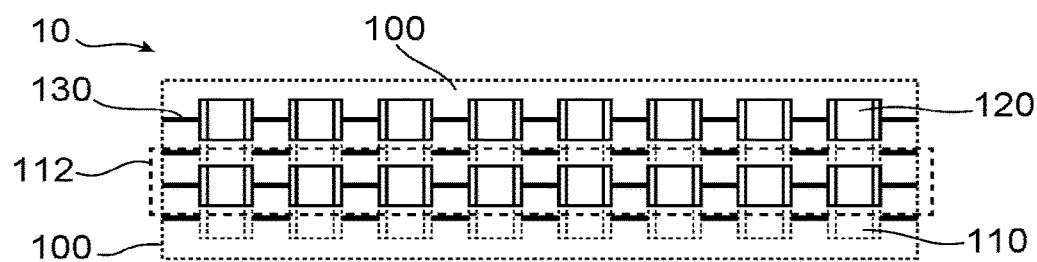
FIG. 3 is a schematic representation of the arrangement of the electrical resistors, according to the invention, of the second stages of each voltage divider on each of the faces of the support, the second stages disposed on the rear face being shown in see-through view.

The electrical resistors 120 of each voltage divider 110 are arranged consecutively according to a first 111 (enclosed in broken lines in FIG. 2a) and a second 112 stage (enclosed in broken lines in FIG. 3).

Figure 1:
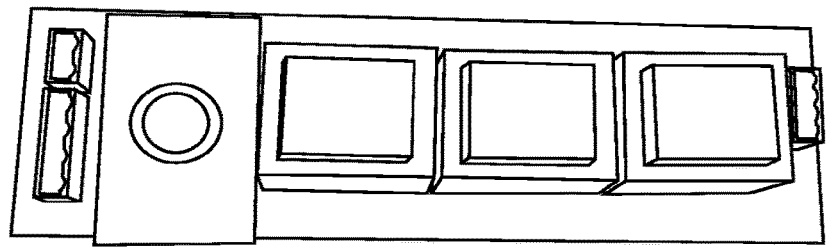
FIG. 1 is a representation of a potential transformer known in the prior art.
Figure 2A:
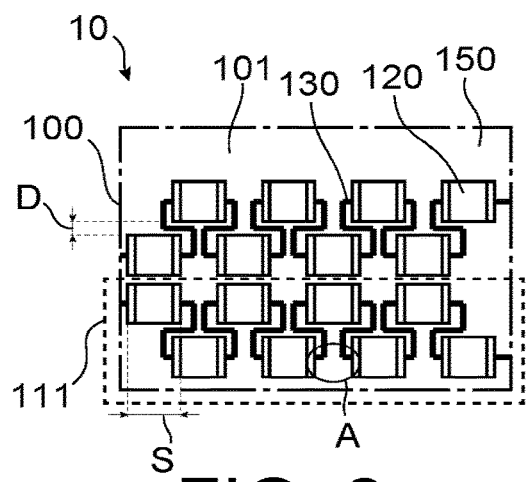
FIGS. 2a and 2b are schematic representations of the arrangement of the electrical resistors of the first stage of the voltage dividers according to the invention, FIG. 2b being a see-through view of said first stages disposed on the rear face of the support.
Figure 2B:
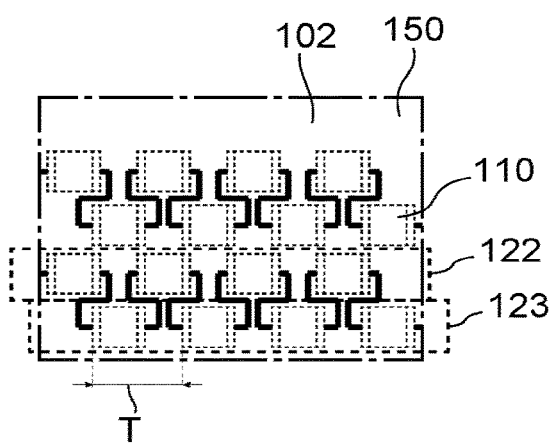

Each first stage 111 comprises a row of even electrical resistors 122 and a row of odd electrical resistors 123 (enclosed in broken lines in FIG. 2b). The two rows of even 122 and odd 123 electrical resistors are parallel to each other along the length L of the face 101/102 of the support 100 on which they are disposed. In other words, all the rows of even 122 and odd 123 resistors of all the voltage dividers 110 are parallel to each other along the direction defined by the length L of the two faces, front 101 and rear 102. By even electrical resistor 122 or odd electrical resistor 123 is meant the parity of its position in the series connection. The series connection of the electrical resistors 120 of the first stage 111 can be arranged such that one out of two electrical resistors 120 is an electrical resistor 120 of the even row 122 of said first stage 111, and the other electrical resistor 120 is an electrical resistor 120 of the odd row 123 of the same first stage. In other words, an odd electrical resistor 123 can only be connected to even electrical resistors 122 at the input and output. In the same way, an even electrical resistor 122 can only be connected to odd electrical resistors 123 at the input and output. It is understood, in this configuration, that the two electrical resistors 120 disposed at the end of the first stage 111 are only connected to a single electrical resistor 120 of the same first stage.

The two rows 122 and 123 of electrical resistors of the first stage 111 of a voltage divider 110 are substantially adjacent along the width l. By substantially adjacent is meant that the row of odd electrical resistors 123 may have a slight offset (offset S illustrated in FIG. 2), in terms of positioning, along the length L, as compared to the row of even electrical resistors 122. The slight offset may be less than the length of an electrical resistor. Moreover, in one advantageous embodiment, one electrical resistor of a row of a first stage is connected in series to the two electrical resistors of the other row of said first stage which are closest to it (except for the two electrical resistors 120 at the end of the first stage). Thus, the length of the tracks 130 can be as short as possible. Furthermore, in this configuration, the potential difference between the two tracks 130, each connected to the input and to the output of a same electrical resistor 120, is small enough to prevent an electric arc in the region of the support where the two tracks are closest to each other (point A of FIG. 2a).

The second stage 112 of each voltage divider 110 comprises electrical resistors 120 arranged in a line.

Given that each voltage divider 110 extends along the length L of the two front 101 and rear 102 faces of the support 100, it will be clear to the person skilled in the art that all the second stages 112 are likewise parallel to each other.

Thus, the arrangement of the voltage dividers 110 on the two faces 101/102 of the support 100 makes it possible to reduce the width of the support 100, and consequently reduce the footprint of the electrical insulation device 10 according to the invention.

Moreover, the arrangement of a portion of the electrical resistors 120 for each voltage divider 110 along a first stage 111 likewise makes it possible to reduce the length of each voltage divider 110 as compared to a voltage divider 110 comprising only electrical resistors 120 connected in series and arranged in a linear manner.

Moreover, the insulation by the voltage dividers 110 comprising electrical resistors 120 connected in series does not present nonlinearities such as those observed in potential transformers. Thus, the voltage divider 110 can scale in homothetic manner the voltage tapped from one phase of a three-phase network, for example (i.e., no distortion of the voltage waveform is induced by the voltage divider).

Finally, the voltage dividers 110 according to the invention do not need a power supply in order to work.

Advantageously, the spacing along the length L between two electrical resistors 120 of a same row of even 122 or odd 123 electrical resistors is less than the spacing needed for the insertion of an electrical resistor. Thus, the arrangement of the first stage 111 makes it possible to increase the "linear" density of electrical resistors 120 along the length L of the faces of the support 100. By "linear" density of electrical resistors 120 along the length L is meant the number of electrical resistors 120 per unit of length of the voltage divider 110. As an example, the electrical resistors 120 of the voltage dividers 110, on the level of the first stage 111, may consist of ruthenium oxide, with a parallelepiped shape of 6.8 mm length, 3.4 mm width, and 0.7 mm height. The spacing along the length L between electrical resistors 120 may be 2 mm.

In advantageous manner, for each of the rows of even 122 and odd 123 electrical resistors, the arrangement of said electrical resistors 120 may be regular along the length L. By regular is meant the same spacing between two consecutive electrical resistors 120 of a same row, whichever electrical resistors 120 of said row are considered. We shall say that the arrangement of the electrical resistors 120 of a row along the length L is periodic, and with a step T. The spacing between electrical resistors 120 may be the same for all the rows of even 122 and odd 123 electrical resistors.

In advantageous manner, all the first stages 111 of the electrical insulation device 10 may be identical. Thus, all the second stages 112 of a same face may be adjacent, two by two, such that the length L of the support 100 can be optimized (i.e., reduced).

Again in advantageous manner, all the second stages 112 of the electrical insulation device 10 may be identical.

According to one advantageous embodiment, the rows of even 122 and odd 123 electrical resistors of a same face may be spaced, along the width l, two by two, with a spacing less than the spacing needed for the insertion of an electrical resistor. Advantageously, this spacing may be regular. By regular is meant the same spacing whichever two adjacent rows are considered for a same face 101/102.

The rows of even 122 electrical resistors of the two faces 101/102 of the support 100 may be in phase with each other.

The rows of odd 123 electrical resistors of the two faces of the support 100 may be in phase with each other.

By rows of even electrical resistors 122 (odd 123) in phase is meant that each row of even resistors 122 (odd 123) can be obtained by a translation of another row of even electrical resistors 122 (odd 123) along the width l and/or along the thickness E (in other words, along a direction perpendicular to the length L).

In advantageous manner, the rows of even electrical resistors 122 have an offset S (represented in FIG. 2a) along the length L in relation to the rows of odd electrical resistors 123.

The offset may advantageously be that of a half step T/2. Thus, the length of the tracks 130 electrically connecting the electrical resistors 120 to each other can be relatively short.

According to the proposed arrangement, electrical resistors 120 of one face may be at least partly opposite electrical resistors 120 of the other face, thus generating crosstalk. It is possible to prevent this phenomenon by disposing suitable means of reducing such crosstalk.

By electrical resistors 120 at least partly opposite is meant that the perpendicular projection of one electrical resistor of one face onto the other face, along the thickness E, is at least partly overlapping an electrical resistor disposed on said other face.

Among the suitable means of reducing crosstalk one may contemplate using a support 100 of sufficient thickness. For example, a support 100 comprising a dielectric material, and with a thickness of at least 3 mm, will make it possible to reduce the crosstalk almost entirely between two resistors opposite each other.

In order to reduce the crosstalk it is also possible to introduce an armouring layer 140 (FIG. 4) in the volume of the support 100. In other words, the support 100 may comprise an armouring layer 140 inserted between two layers of electrical insulator 104/105. By armouring layer 140 is meant a layer able to attenuate, or even prevent, the electromagnetic exchanges or communications between two electrical resistors 120 facing each other. In other words, the armouring layer 140 shields out the crosstalk. The two layers of electrical insulator 104/105 may be composed of at least one of the materials chosen from among: epoxy, FR4, bakelite.

The armouring layer 140 may be disposed substantially parallel with the two layers of insulator.

The armouring layer 140 may extend for a dimension equivalent to that of the front 101 and rear 102 faces.

The armouring layer 140 may comprise a stack of several layers. For example, the armouring layer 140 may comprise in succession a first metallic layer 141, a layer made of an insulator 142, and a second metallic layer 143.

The first 141 and the second 143 metallic layers may be composed of copper.

The first 141 and the second 143 metallic layers may have a thickness of 17.5 µm, and the layer made of insulator 142 may have a thickness of 200 µm.

We shall now describe one particular arrangement of the second stages 112 making it possible to reduce the thickness of the support 100. In fact, the thickness of the armouring layer 140 is directly proportional to its extension. Thus, according to a particular embodiment of the invention, it may be required to reduce the extension of the armouring layer 140 in order to also reduce the thickness E of the support 100.

Thus, advantageously, the armouring layer 140 extends only over a first surface 150, the first surface 150 being the surface opposite the surface occupied by the first stages 111 on the front face 101 and the rear face 102.

The reduction of the surface occupied by the armouring layer 140 makes it possible to reduce the thickness of the latter while keeping the same efficiency in terms of shielding out crosstalk in the area of the first stages 111.

On the other hand, the shielding out of crosstalk in the area of the second stages is no longer effective. Thus, it may be worthwhile providing said second stages 112 with a particular disposition.

Advantageously, the second stages 112 are arranged in parallel with each other along the length L, the second stages 112 of the front face 101 being staggered along the width l in relation to the second stages 112 of the rear face 102 such that no electrical resistor of the second stages 112 of a face is facing, even partially, another electrical resistor arranged on the other face. Thus, according to this arrangement of the second stages 112, there is no crosstalk between the electrical resistors 120 comprised in the second stages 112. This arrangement thus justifies the limiting of the extension of the armouring layer 140 to the first surface 150, and thus allows a reduction in the thickness of the support 100.

Advantageously, two first stages 111 each disposed on a different face of the support 100 can only have a single row of electrical resistors 120 facing each other across the thickness E of the support 100, so that at least one row of resistors on one of the two faces is not facing any row disposed on the other face. One may also consider further reducing the extension of the armouring layer 140 to one surface across which electrical resistors 120 of the first stages 111 are facing each other. Thus, the armouring layer 140 extends only over a second surface 160, the second surface 160 being limited to the projection along the direction E of the surface occupied by the rows of the front face 101 each facing a row of the rear face 102. Thus, since there are only four rows of electrical resistors on a face, only three of the four rows of electrical resistors need a shielding out by the armouring layer.

For the embodiments presented, the second stages 112 of the voltage dividers 110 may comprise one free end 170 (FIG. 6) designed to be connected to a source of low voltage. For example, the electrical insulation device 10 may have four voltage dividers 110, and consequently four second stages 112 disposed on either side of the support 100, said four second stages 112 being designed to withdraw the voltages from a three-phase line (for example, a three-phase low-voltage line comprising 3 phases and a neutral).

For all the embodiments presented, the first stages 111 of the voltage dividers 110 can comprise one free end 180 (FIG. 6) designed to be connected to a voltage measuring device. For example, the electrical insulation device 10 may have four voltage dividers 110, and consequently four first stages 111 disposed on either side of the support 100, said four second stages 112 being designed to communicate a voltage to a voltage measuring device (such as a voltmeter, not represented).

Figure 5A:
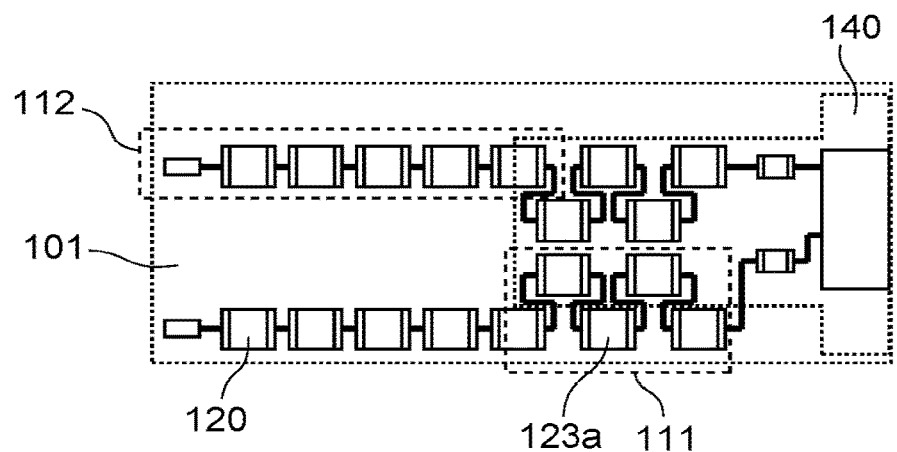
FIGS. 5a and 5b are schematic representations of the electrical insulation device, according to the invention, in top view (FIG. 5a) and see-through view through the front face (FIG. 5b)
Figure 5B:
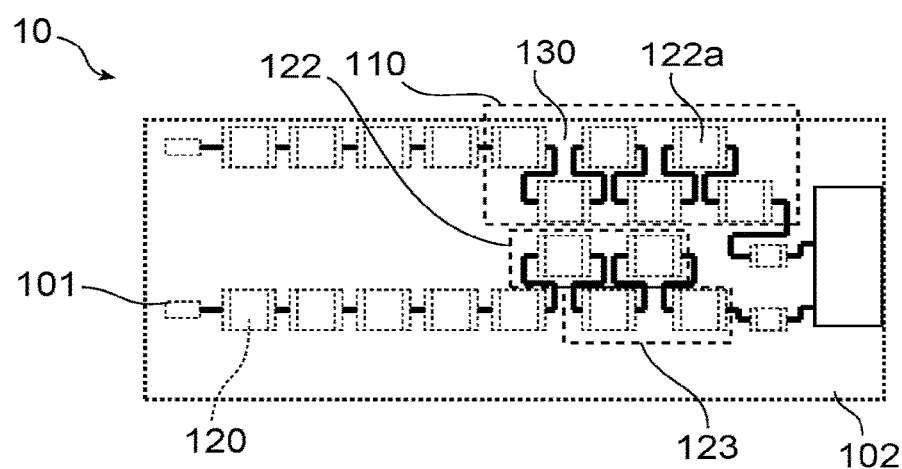
Figure 6:
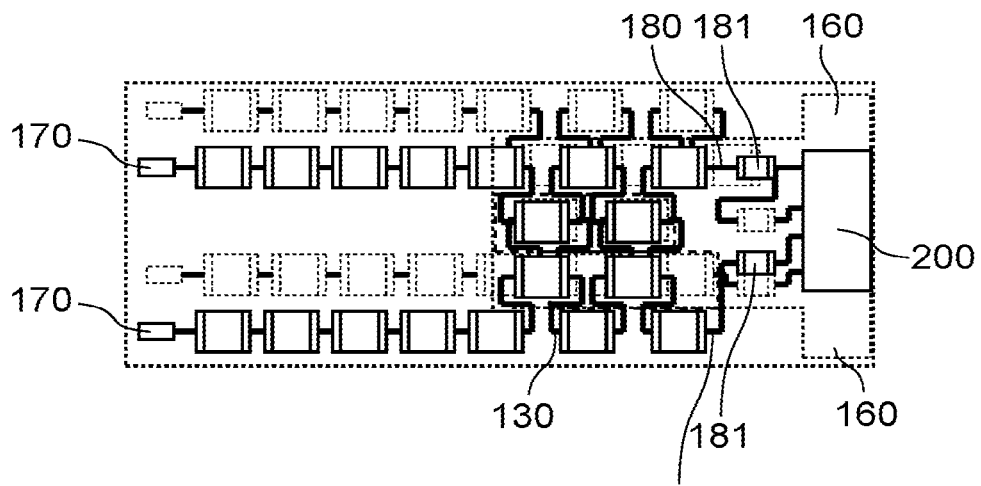
FIG. 6 is a schematic representation, according to the invention, of the electrical insulation device (the electrical resistors of the rear face being shown in see-through view through the front face), FIGS. 7a, b, c are a schematic representation, according to the invention, of the electrical insulation device prior to moulding (FIG. 7a), the moulding which will go around the insulation device (FIG. 7b) and the overmoulding which will go around the moulding (FIG. 7c)
Figure 7A:
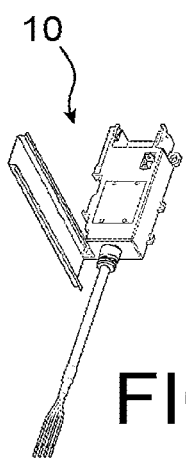
Figure 7B:
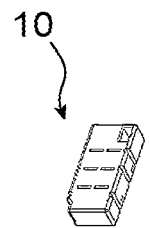
Figure 7C:
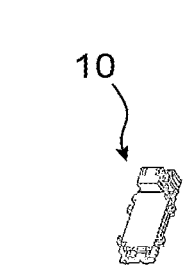

We shall now describe an exemplary embodiment of an electrical insulation device 10 according to the invention, making reference to FIGS. 5 and 6.

In the example presented, the electrical insulation device 10 is designed to ensure an insulation of a three-phase low-voltage line in keeping with the standard IEC60664-1, IEC60255-27, IEC60255-5.

The electrical insulation device 10 thus comprises four identical voltage dividers 110 disposed in pairs on each of the faces of a support 100.

The support has a length L of 76 mm, a width l of 29 mm, and a thickness E of 1.6 mm.

Each voltage divider 110 comprises electrical resistors 120 that are electrically connected in series and arranged according to a first 111 and a second 112 stage, each stage comprising four electrical resistors 120. The voltage dividers 110 may each comprise a resistor, known as a "base resistor" 181, connected in series in the area of the end 180 of the first stage 111.

The electrical resistors 120 can be made of ruthenium oxide, and may have an electrical resistance of $3.16*10^6$ ohm.

The second stages 112 are arranged in parallel with each other along the length L, the second stages 112 of the front face 101 possibly being staggered by a distance 0.5 mm (in FIG. 3) along the width l in relation to the second stages 112 of the rear face 102 such that no electrical resistor of the second stages 112 of a face is facing, even partially, another electrical resistor arranged on the other face.

The first stages 111 are likewise arranged such that one row of even electrical resistors 122a on one face and one row of odd electrical resistors 123a on the other face are each not facing any row of electrical resistors. This configuration allows limiting of the surface of the armouring layer 140 to the second surface 160 presented in FIG. 6. No shielding out of crosstalk is needed in the area of the rows 122a and 123a.

The armouring layer 140 comprises in succession a layer made of a dielectric material, of 200 µm in thickness, inserted between two layers of copper of 17.5 µm thickness each. As for the armouring layer 140, this is inserted between two layers of a dielectric material of 650 µm thickness each. Thus, the thickness of the support 100 is around 1.6 mm.

The free end 180 or, as the case may be, the base resistor 181, of the first stages 111 can be connected to a voltage measuring device by means of a connector 200 (such as an RJ45 Ethernet connector).

The electrical insulation device 10 (FIG. 7a) may comprise a moulding (FIG. 7b) and an overmoulding (FIG. 7c) designed to provide a better insulation, a better mechanical strength, and a protection against moisture.

The material used for the moulding may have a slight dimensional variation in temperature and under mechanical stress, as well as a good dielectric strength and a chemical compatibility with electronic components, so as not to degrade the internal components. For example, the material used for the moulding may be composed of a thermoplastic fibred polyester, such as: RYNITE™ 415HP.

Figure 9A:
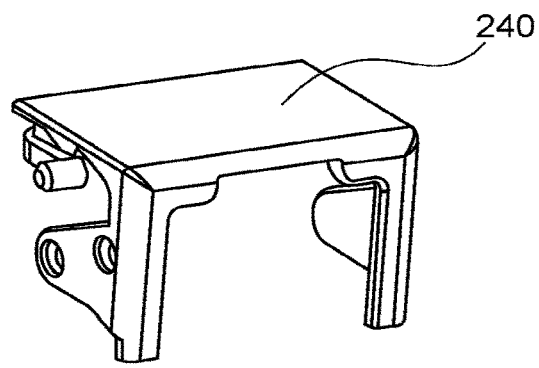
FIG. 9a is a schematic representation of the protective flap, shown in isolation.
Figure 9B:
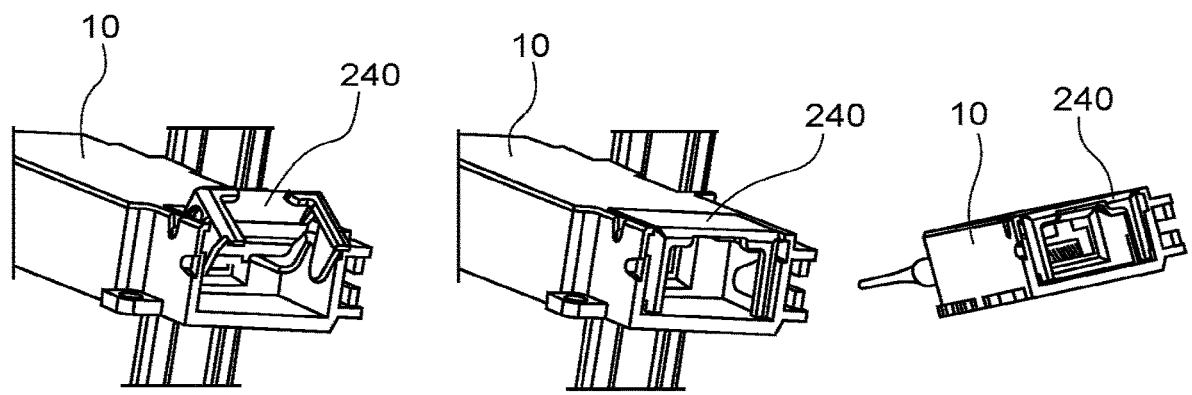
FIG. 9b is a schematic representation of the protective flap inserted in the electrical insulation device according to the invention.

The electrical insulation device 10 may likewise comprise a protective flap 240 in the area of the connector 200 in order to guarantee a protection index of IP2x (FIGS. 9a and 9b). Said protective flap may likewise comprise two openings designed to each accommodate a seal in a position indicating that a connection cable has been inserted or removed. The seal likewise prevents any inadvertent wrong manipulation.

The device may likewise comprise a grounding terminal 220. The grounding terminal 220 makes it possible to easily adapt, during the installation process, the insulation device according to the invention to the type of medium voltage or low voltage neutral system. Furthermore, the grounding terminal helps increase the resistance to electromagnetic interference.

Figure 8:
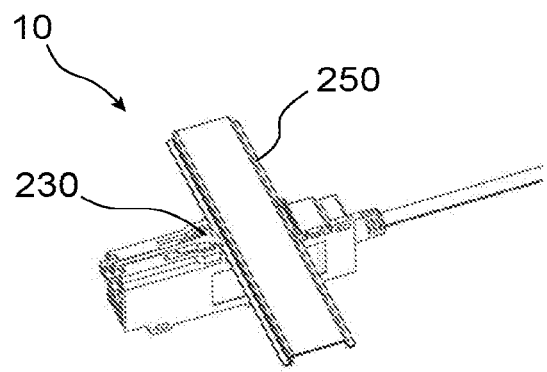
FIG. 8 is a schematic representation, according to the invention, of the electrical insulation device mounted on a DIN rail.

Finally, the electrical insulation device 10 may comprise means of fixation 230 to a rail 250, such as a DIN rail (FIG. 8). The means of fixation 230 for example may comprise a spring-mounted stop system. Alternatively, or additionally, the means of fixation may comprise Telequick™ fixations.

The elements and characteristics described in this latter embodiment are transposable to the other embodiments described in the invention.

The electrical insulation device 10 according to the invention may be present in the form of a module and with reduced size as compared to the known solutions of the prior art. It may thus be fixed to an electrical panel bringing together the other elements.

The device does not require any power supply to function and it presents linear electrical characteristics.

The electrical panel may bring together a group of modules (such as MV modules and LV modules) disposed on rails (such as DIN rails).

The insulation device 10 according to the invention meets the demands of the standard IEC60664-1, IEC60255-27, IEC60255-5, and is able to ensure the safety of workers during operations of maintenance and/or monitoring of electrical installations (household installations, for example).

The insulation device 10 according to the invention likewise comprises voltage dividers made of passive linear components (the electrical resistors 120) which thus ensure a linear scaling of the voltage to be measured. The insulation devices 10 thus meet the demanded criteria for measurement quality.

The invention claimed is:

1. An electrical insulation device comprising:
   a support with thickness E comprising two faces facing one another, referred to, respectively, as front face and rear face, the two faces having a length L, a width l;
   on each face of the support, a plurality of voltage dividers is positioned extending over the length L of said face, each voltage divider comprising electrical components that are connected in series and arranged consecutively according to a first and a second stage, each first stage comprising a row of even electrical components and a row of odd electrical components, the two rows being parallel along the length L, and substantially adjacent along the width l, and each second stage corresponding to a linear arrangement of the electrical components.

2. The device according to claim 1, wherein for each of the rows of even electrical components and the rows of odd electrical components the spacing along the length L between two electrical components of a same row is less than the spacing needed for the insertion of an electrical component.

3. The device according to claim 1, wherein the spacing along the width l of the rows of even electrical components and the rows of odd electrical components arranged on a same face is regular, said spacing being less than a spacing needed for insertion of an electrical component.

4. The device according to claim 1, wherein in each of the rows of even and odd electrical components the arrangement of said electrical components is regular along a step T in the direction of the length L.

5. The device according to claim 4, wherein the rows of even electrical components of the two faces of the support are in phase with each other, and the rows of odd electrical components of the two faces of the support are likewise in phase with each other, the rows of even electrical components have an offset along the length L with respect to the rows of odd electrical components, the offset being that of a half-step T/2.

6. The device according to claim 1, wherein the support comprises an armouring layer inserted between two layers of electrical insulator, and disposed substantially parallel to the two faces of the support, the armouring layer being adapted to reduce the crosstalk between electrical components facing each other across the thickness E of the support.

7. The device according to claim 6, wherein the armouring layer extends only over a first surface, the first surface being the surface facing the surface occupied by the first stages on the front face and the rear face.

8. The device according to claim 7, wherein two first stages each disposed on a different face of the support can have only a single row of electrical components facing each other across the thickness E of the support, so that at least one row of components on one of the two faces is not facing any row disposed on the other face, the armouring layer extends only over a second surface, the second surface being limited to the projection along the direction E of the surface occupied by the rows of the front face each facing a row of the rear face.

9. The device according to claim 1, wherein the second stages of the front and rear faces are arranged in parallel with each other along the length L, the second stages of the front face being staggered along the width l in relation to the second stages of the rear face such that no electrical component of the second stages of a face is facing, even partially, another electrical component arranged on the other face.

10. The device according to claim 1, wherein the second stages of the voltage dividers comprise one free end designed to be connected to a source of low voltage.

11. The device according to claim 1, wherein the first stages of the voltage dividers each comprise one free end designed to be connected to a voltage measuring device.

12. The device according to claim 1, wherein the electrical components of the voltage dividers form a printed circuit board with the support.

13. The device according to claim 1, wherein all the electrical components of all the voltage dividers are identical, and the electrical components are electrical resistors.

14. The device according to claim 1, wherein the support comprising the voltage dividers furthermore comprises a moulding and an overmoulding designed to provide an electrical insulation and a mechanical strength of the device.

15. The device according to claim 14, wherein the device is provided with fixation on a rail.

16. The device according to claim 15, wherein the rail is a DIN rail.

* * * * *